JAMES F. GIBBONS
*INVENTOR.*

*BY*

Flehr and Swain
ATTORNEYS

JAMES F. GIBBONS
*INVENTOR.*

*BY*

Flehr and Swain
ATTORNEYS

United States Patent Office 3,192,320
Patented June 29, 1965

3,192,320
AUDIO AMPLIFIER WITH MODULATED SWITCHING INPUT FOR STORED CHARGE PULSE GENERATOR

James F. Gibbons, Palo Alto, Calif., assignor to Clevite Corporation, Cleveland, Ohio, a corporation of Ohio
Filed Mar. 6, 1961, Ser. No. 93,384
5 Claims. (Cl. 179—1)

This invention relates generally to an audio amplifier and more particularly to an audio amplifier employing semiconductor switching devices.

It is an object of the present invention to provide an audio amplifier circuit which is simple and inexpensive in construction and which has good fidelity and high gain.

It is another object of the present invention to provide an audio amplifier circuit in which the active elements comprise semiconductive switching devices of the type having a first state in which the devices present a relatively high impedance and a second state in which the devices present a relatively low impedance. The devices are switched from the first or high impedance state to the second or low impedance state in response to a predetermined switching voltage $V_B$ and switched from the second or low impedance state to the first or high impedance state when the current through the device is reduced below a predetermined holding current value $I_H$.

The audio amplifier of the present invention employs a frequency modulated oscillator employing semiconductive switching devices of the foregoing character which oscillate at a rate determined by a timing circuit to form pulses whose mean frequency is dependent upon the timing circuit. The frequency of operation is selected to be well above the highest audio frequency to be amplified. The oscillator is connected to receive the audio signal voltage. The audio signal modulates the oscillator so that its oscillation frequency varies above or below the mean frequency depending upon the polarity of the input audio signal voltage. Filter means are associated with the output of the oscillator for recovering an amplified audio output signal from the frequency modulated pulses. Additionally, means, including switching devices of the above type, may be provided for receiving the frequency modulated signal and provide further power amplification prior to recovery of the audio signal.

The foregoing and other objects of the invention will become more clearly apparent from the following description when taken in conjunction with the accompanying drawings.

Referring to the drawings.

Figure 1:
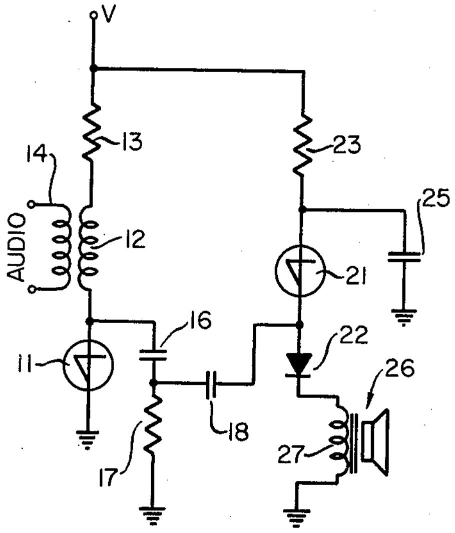
FIGURE 1 shows an audio amplifier in accordance with one embodiment of the invention.

Referring to FIGURE 1, there is shown the series combination of a semiconductor switching device 11, the secondary of an input transformer 12 and a current limiting resistor 13 connected between a source of voltage V and ground. The primary 14 of the transformer 12 is adapted to be connected to a source of audio signals and serves to modulate the voltage appearing across the switching device 11 in accordance with the input audio voltage.

Connected in shunt with the switching device 11 is the series combination of capacitor 16 and load or output resistor 17. The voltage at the resistor 17 is capacitively coupled by a capacitor 18 to the common junction of a semiconductor switching device 21 and a diode 22. The diode 22 and switching device 21 are connected in series with current limiting resistor 23 and an output load. The load in the illustrative embodiment is a speaker 26 with its coils 27 connected in the series combination. Because of the inherent characteristics of the speaker, it serves to average the pulses applied thereto, as will be presently described, to recover the amplified audio signal. It will be apparent from the following description that the load may comprise a resistance which, in turn, is connected to an averaging circuit.

Figure 7:
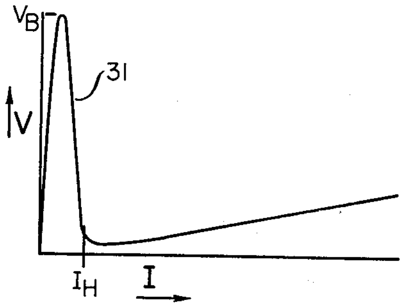
FIGURE 7 shows the voltage current characteristics for a suitable semiconductor switching device.

To facilitate understanding of the operation of the circuit, a description of the operation of semiconductor switching devices of the type shown at 11 and 21 is presented. Referring to FIGURE 7, there is shown a curve of voltage as a function of current for a suitable switching device. It is noted that the current through the device is relatively low when the device is in its high impedance state. The impedance of the device may be in the order of 10 megohms or more. As the voltage across the device is increased, a voltage $V_B$ is reached, at which point the device becomes unstable. There is a region of negative resistance shown by the portion 31 of the curve. The device then is switched into a high current, low impedance state. The impedance of the device is very small, in the order of 5 ohms or less. The device remains in its low impedance state until the current is reduced to a value below the holding current $I_H$. When the current is reduced below $I_H$, the device switches back to its high impedance, low current state.

Figure 4:
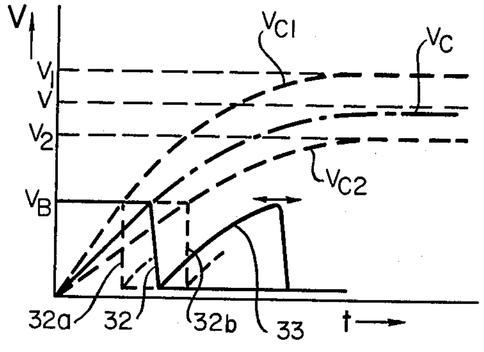
FIGURE 4 is a diagram showing voltage as a function of time at various points in the circuits shown in the various figures.

Referring now to FIGURES 1 and 4, operation of the oscillator portion of the circuit is substantially as follows: A supply voltage V is applied which is greater than the breakdown voltage $V_B$ for the device 11. Assuming that the device is in its high impedance state, there is negligible current flow through the device to ground. Current will, however, flow to the capacitor 16 which charges up towards the voltage V as indicated by the curve $V_c$, FIGURE 4. However, as the voltage on the capacitor increases, it reaches the breakdown voltage $V_B$ of the switching device 11. At this point, the device 11 switches and in essence connects the capacitor to ground. The capacitor discharges to ground through the device as indicated by the portion 32 of the curve. The resistor 13, is, however, chosen such that it will not supply sufficient holding current $I_H$ to the device. Thus, as soon as the capacitor has discharged a predetermined amount, the current through the device will be reduced below the holding value and the device 11 will switch back into its high impedance state. The capacitor then charges along the line 33 and the process is repeated.

Figure 5:
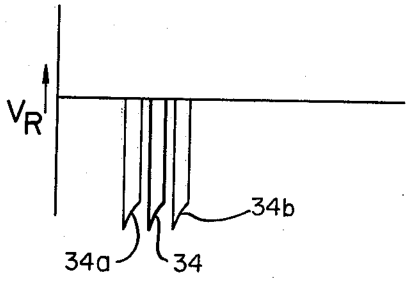
FIGURE 5 shows the modulated output pulses.

The voltage across the resistor 17 is shown by the pulse 34, FIGURE 5. A pulse is generated for each cycle of the oscillator.

If the total voltage V has added thereto or subtracted therefrom a voltage which varies at the audio rate, then the voltage will vary as shown by the dotted lines $V_1$ and $V_2$ of FIGURE 4. The capacitor will charge along the lines $V_{C1}$ and $V_{C2}$ of the figure. It is seen that if it charges toward the value $V_1$, the breakdown voltage will be arrived at a period of time sooner than would be with no audio voltage applied. Likewise, this is indicated by the curve 32*a*. If the voltage is reduced as shown by $V_{C2}$, the capacitor will charge at a slower rate and the breakdown voltage will be reached at a later time as indicated by the breakdown curve 32*b*.

By applying an audio input signal to the primary transformer 14, it is seen that the frequency of operation of the oscillator will be varied above and below its mean frequency, *f*, at an audio rate. The audio frequency may be recovered by averaging the voltage pulses which appear across the resistor 17. This can be done with a filter circuit or can be done by replacing resistor 17 with a speaker. The power output at this point is very low.

Figure 6:
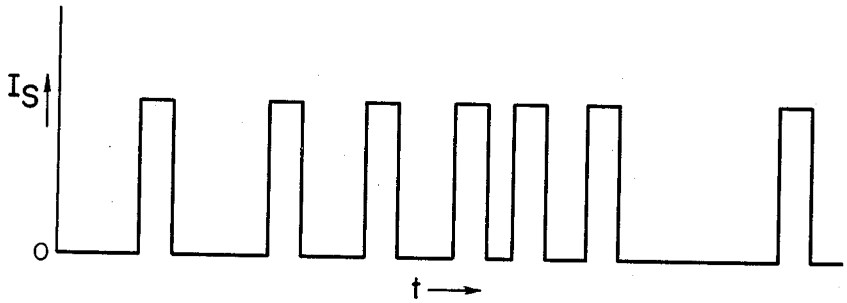
FIGURE 6 shows the output of a power amplifier stage.

It is desirable to amplify the pulses. Thus, the amplifier circuit of the instant invention includes a power amplifying portion including the series parallel combination of switching device 21, diode 22, resistor 23, capacitor 25 and coil 27 of the speaker 26. The switching device 21 is normally selected so that the voltage V is insufficient to cause the same to switch into its low conductance state. However, during each pulse 34, a negative voltage is applied to the common terminal of the conventional diode 22 and the switching device, which voltage serves to increase the voltage across the device 21 and cause it to discharge the capacitor 25 to ground whereby the energy stored in the capacitor is applied to the speaker. As soon as the capacitor has discharged an amount such that the current from the capacitor added to the current through resistor 23 in less than $I_H$ the device 21 turns off. The capacitor 25 is then recharged through resistor 23. Thus the circuit including the four-layer diode 21, the diode 22, resistor 23 and capacitor 25 serves as a triggered pulse generator. It is seen from FIGURE 6 that the average of the pulses will give an audio output. In practice, the frequency of operation of the oscillator is selected to be substantially greater than the highest audio signal frequency. For example, in an audio amplifier for sound, the oscillator may have a mean frequency of 100 kilocycles.

It is to be noted that the circuit shown is a relatively high efficiency, high power circuit. The devices 11 and 21 are either turned fully on or fully off. The major losses being those in the resistor 23.

Figure 2:
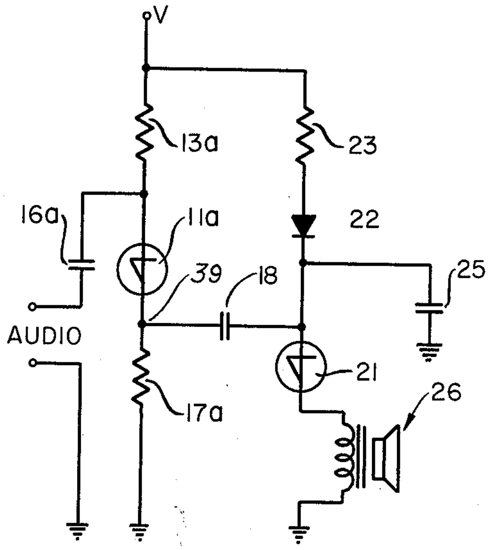
FIGURE 2 shows an audio amplifier in accordance with a second embodiment of the invention.

Referring now to the circuits shown in FIGURE 2, the power amplifier stage is similar to that shown in FIGURE 1. Thus, it includes the resistor 23, conventional diode 22, switching diode 21, capacitor 25 and a speaker designated as 26. The oscillator portion of the circuit is slightly different in the arrangement of the components but operates essentially in a similar manner. The switching device 11*a* is serially connected with a current limiting resistor 13*a*. The load resistor 17*a* is connected in series between the switching device 11*a* and ground. The timing capacitor 16*a* is connected in shunt with the switching device 11*a* and has applied in series therewith the audio voltage.

Assuming absence of audio voltage, the circuit will operate whereby the capacitor 16*a* charges towards the voltage V and when it reaches the breakdown voltage, the device 11*a* will switch to its low resistance state. At this time, a positive pulse will appear at the terminal 39 of the resistor 17*a*. This positive pulse is applied to the common junction of the switching device 21 and diode 22. The positive pulse will serve to raise the voltage across the diode 21 and cause the same to breakdown to give an output current pulse.

Application of an audio voltage will serve to modulate the voltage on the capacitor to alter the operating frequency of the oscillator, as previously described.

Figure 3:
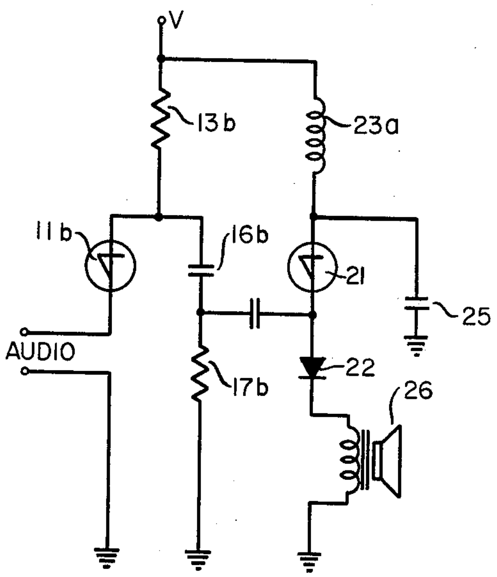
FIGURE 3 shows an audio amplifier in accordance with still another embodiment of the invention.

Referring to FIGURE 3, a similar circuit is shown in which the power amplifying components are arranged similarly to those in FIGURE 1. However, an inductor 23*a* is substituted for the resistor 23. This will increase the efficiency of the circuit. The current limiting resistor 13*b* is serially connected with the switching device 11*b*, and the audio signal to be amplified is applied in series with the device 11*b*. Thus, the audio signal will add to or subtract from the voltage appearing across the device 11*b*. It is noted that the timing capacitor 16*b* is connected in series with the load resistor 17*b*. It has a constant voltage applied thereto. If the breakdown voltage of the switching device 11*b* is suitably selected, then the circuit shown in FIGURE 3 will operate more linearly in response to audio signals than the circuits previously described.

Operation of the circuit of FIGURE 3 is as previously described. Negative pulses are formed and applied to the common terminal of the switching device 21 and diode 22 to form amplified pulses for application to the speaker 26.

In many instances the audio voltage available is very low and amplification may be necessary to get the desired frequency shift. Further it is observed that in general the oscillators operate by charging to different voltages to vary the frequency.

Figure 8:
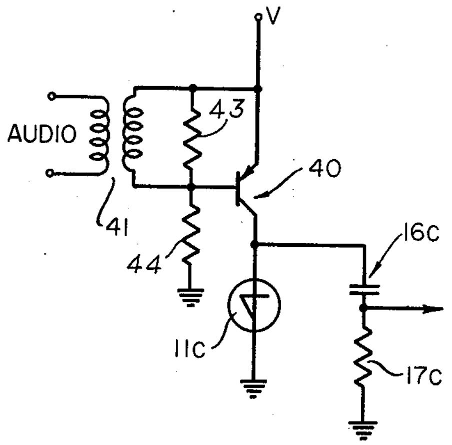
FIGURE 8 shows another amplifier or modulator.

Referring to FIGURE 8 there is shown an oscillator circuit employed as a modulator in which the rate of charging of the capacitor is varied by effectively varying the impedance of the transistor 40 which is comparable to the resistance 13 of FIGURE 1. Furthermore, the circuit acts as an amplifier. The circuit shown is capable of accepting small audio signals and developing large frequency shifts.

In the circuit the resistance is replaced by a transistor having its emitter and collector serially connected in the line and the audio signal applied between emitter and base by transformer 41. Suitable bias is applied to the base by the resistive voltage divider including resistors 43 and 44. The transistor then operates to vary the current supplied to charge the capacitor 16.

I claim:

1. An audio amplifier comprising a semiconductor switching device having at least two terminals, said device being of the type having a first stable state in which a high impedance is present between said terminals and a second stable state in which a low impedance is present between said terminals, said device being switched from its first state to its second state in response to a predetermined switching voltage applied between the terminals and switched from its second state to its first state in response to a current below a predetermined holding current, a resistance connected in series with said device, means for applying a voltage across said series combination which is greater than the switching voltage, said resistance having a value such that when the device is in its second state the current flowing therethrough is below said predetermined holding current, a capacitor connected in shunt with said device, said resistor, switching device and capacitor forming an oscillating circuit which operates at a predetermined frequency, means for applying a signal voltage to be amplified to said circuit to modulate the voltage across the device in accordance therewith to form a pulse train of varying frequency, pulse generator means forming pulses to be triggered by said train of pulses to provide output pulses having a frequency dependent upon the output frequency of said oscillator, and means for receiving said pulses and averaging the same to recover the amplified signal voltage.

2. An audio amplifier as in claim 1 wherein said means for averaging said pulses comprises a speaker.

3. An audio amplifier comprising a semiconductor switching device having at least two terminals, said device being of the type having a first stable state in which a high impedance is present between said terminals and a second stable state in which a low impedance is present between said terminals, said device being switched from its first state to its second state in response to a predetermined switching voltage applied between the terminals and switched from its second state to its first state in response to a current below a predetermined holding current, a resistance connected in series with said device, means for applying a voltage across said series combination which is greater than the switching voltage, said resistance having a value such that when the device is in its second state the current flowing therethrough is below said predetermined holding current, a capacitor connected in shunt with said device, said resistance, switching device and capacitor forming an oscillating circuit which operates at a predetermined frequency, means for applying a signal voltage to be amplified to said circuit to modulate the voltage across the device in accordance therewith, means forming output pulses having a frequency dependent upon the frequency of operation of said oscillator, pulse amplifying means connected to receive and further amplify said pulses prior to recovering the signal voltage, said pulse amplifying means including a switching device, said device being of the type having a first stable state in which a high impedance is present between said terminals and a second stable state in which a low impedance is present between said terminals, said device being switched from its first state to its second state in response to a predetermined voltage applied between the terminals and switched from its second state to its first state in response to a current below a predetermined holding current, resistance means and a diode connected in series therewith, said pulses being applied to the common terminal of the diode and switching device, a capacitor connected in shunt with the switching device and means for applying a voltage across said series combination which is less than the switching voltage of the device, said pulses serving to switch the device into its second state whereby a charge stored in the capacitor is passed therethrough.

4. An audio amplifier as in claim 3 wherein said resistance means comprises an active element having its resistance varied by the signal.

5. An audio amplifier as in claim 4 wherein the active element comprises a transistor.

References Cited by the Examiner

UNITED STATES PATENTS

| | | | |
|---|---|---|---|
| 2,470,698 | 5/49 | Hansell | 332—14 |
| 2,544,211 | 3/51 | Barton | 330—29 |
| 2,552,496 | 5/51 | Rinia | 329—107 |
| 2,617,027 | 11/52 | Douma | 329—107 |
| 2,990,516 | 6/61 | Johannessen | 330—17 X |
| 2,991,415 | 7/61 | Pierson | 328—140 X |
| 2,997,604 | 8/61 | Shockley | 307—88.5 |
| 3,018,392 | 1/62 | Jones et al. | 307—88.5 |
| 3,048,710 | 8/62 | Shockley | 307—88.5 |

OTHER REFERENCES

Proceedings of the IRE, July 1959, article by Sommers, Jr., "Tunnel Diodes as High-Frequency Devices," pages 1201–1206.

ROY LAKE, *Primary Examiner.*

NATHAN KAUFMAN, *Examiner.*